US011393861B2

(12) United States Patent
Bonakdar et al.

(10) Patent No.: US 11,393,861 B2
(45) Date of Patent: Jul. 19, 2022

(54) FLARE-SUPPRESSING IMAGE SENSOR

(71) Applicant: OmniVision Technologies, Inc., Santa Clara, CA (US)

(72) Inventors: Alireza Bonakdar, San Jose, CA (US); Zhiqiang Lin, San Jose, CA (US); Chen-Wei Lu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 86 days.

(21) Appl. No.: 16/777,090

(22) Filed: Jan. 30, 2020

(65) Prior Publication Data

US 2021/0242262 A1 Aug. 5, 2021

(51) Int. Cl.
*H01L 27/146* (2006.01)
*G02B 3/00* (2006.01)

(52) U.S. Cl.
CPC ...... *H01L 27/14627* (2013.01); *G02B 3/0037* (2013.01); *H01L 27/14605* (2013.01); *H01L 27/14621* (2013.01); *H01L 27/14623* (2013.01); *H01L 27/14645* (2013.01)

(58) Field of Classification Search
CPC .................. H01L 27/1463; H01L 27/1461
See application file for complete search history.

(56) References Cited

U.S. PATENT DOCUMENTS

| 4,348,254 | A | 9/1982 | Lindmayer |
| 7,973,380 | B2 | 7/2011 | Hsu et al. |
| 8,530,266 | B1 | 9/2013 | Chen et al. |
| 8,716,594 | B2 | 5/2014 | Dutta |
| 9,030,550 | B2 | 5/2015 | Georgiev |
| 9,780,131 | B1 | 10/2017 | Woo et al. |
| 9,954,020 | B1 | 4/2018 | Lu et al. |
| 10,811,453 | B1 * | 10/2020 | Mun ................... H01L 27/1463 |
| 2004/0100570 | A1 * | 5/2004 | Shizukuishi ......... H04N 9/0451 |
| | | | 348/272 |
| 2008/0018765 | A1 * | 1/2008 | Choi ................. H01L 27/14656 |
| | | | 348/308 |
| 2008/0142686 | A1 | 6/2008 | Konno et al. |

(Continued)

FOREIGN PATENT DOCUMENTS

| CN | 103399368 A | 11/2013 |
| CN | 203365711 U | 12/2013 |

(Continued)

OTHER PUBLICATIONS

U.S. Appl. No. 16/777,193, Office Action dated Sep. 15, 2021, 10 pages.

(Continued)

*Primary Examiner* — Jarrett J Stark
(74) *Attorney, Agent, or Firm* — Lathrop GPM LLP (57) ABSTRACT

A flare-suppressing image sensor includes a first pixel formed in a substrate and a refractive element located above the first pixel. The refractive element has, with respect to a top surface of the substrate, a height profile having at least two one-dimensional local maxima in each of a first cross-sectional plane and a second cross-sectional plane perpendicular to the first cross-sectional plane. Each of the first and second cross-sectional planes is perpendicular to the top surface and intersects the first pixel.

17 Claims, 7 Drawing Sheets

(56) References Cited

U.S. PATENT DOCUMENTS

| | | | |
|---|---|---|---|
| 2011/0298074 A1* | 12/2011 | Funao | H01L 27/14629 257/432 |
| 2012/0086094 A1* | 4/2012 | Watanabe | H01L 27/14623 257/432 |
| 2012/0217602 A1* | 8/2012 | Enomoto | H04N 5/374 257/432 |
| 2013/0050526 A1 | 2/2013 | Keelan | |
| 2013/0200251 A1 | 8/2013 | Velichko | |
| 2013/0270665 A1* | 10/2013 | Sasaki | H01L 27/14625 257/432 |
| 2014/0267848 A1* | 9/2014 | Wu | G06T 19/006 348/277 |
| 2014/0346628 A1* | 11/2014 | Okazaki | H01L 27/14645 257/432 |
| 2015/0001660 A1* | 1/2015 | Fukumizu | H01L 27/1463 257/432 |
| 2015/0091122 A1* | 4/2015 | Okazaki | H01L 27/1463 257/446 |
| 2015/0097213 A1* | 4/2015 | Chen | H01L 27/14656 257/228 |
| 2015/0162365 A1* | 6/2015 | Chang | H01L 27/14623 257/460 |
| 2015/0206921 A1* | 7/2015 | Imoto | H01L 27/14636 257/230 |
| 2015/0236066 A1* | 8/2015 | Tayanaka | H01L 27/14685 257/432 |
| 2016/0035770 A1 | 2/2016 | Ahn et al. | |
| 2016/0049430 A1* | 2/2016 | Nomura | H01L 27/1463 257/432 |
| 2016/0064430 A1* | 3/2016 | Lee | H01L 27/14649 348/302 |
| 2017/0338265 A1* | 11/2017 | Yoshiba | H04N 9/04557 |
| 2017/0352771 A1 | 12/2017 | Gu et al. | |
| 2018/0084185 A1 | 3/2018 | Lu et al. | |
| 2018/0160058 A1* | 6/2018 | Nakata | H01L 27/14621 |
| 2018/0277580 A1* | 9/2018 | Chiang | H01L 27/14627 |
| 2018/0308883 A1* | 10/2018 | Yanagita | H04N 5/35563 |
| 2019/0035838 A1* | 1/2019 | Byun | H01L 27/14621 |
| 2019/0067346 A1* | 2/2019 | Borthakur | G02B 6/12019 |
| 2019/0096945 A1* | 3/2019 | Lu | H01L 27/14645 |
| 2019/0103430 A1* | 4/2019 | Tayanaka | H01L 27/14605 |
| 2019/0131328 A1* | 5/2019 | Kim | H01L 27/14614 |
| 2019/0148448 A1* | 5/2019 | Lee | H01L 27/1463 257/431 |
| 2020/0013808 A1* | 1/2020 | Kumagai | H01L 27/1463 |
| 2020/0348455 A1* | 11/2020 | Summa | B29D 11/00278 |
| 2021/0074751 A1* | 3/2021 | Bonakdar | H01L 27/14627 |
| 2021/0151482 A1* | 5/2021 | Phan | H01L 27/14621 |
| 2021/0183924 A1 | 6/2021 | Manda et al. | |
| 2021/0193727 A1* | 6/2021 | Asatsuma | H04N 5/369 |
| 2021/0202546 A1* | 7/2021 | Liu | H01L 27/14627 |
| 2021/0242259 A1* | 8/2021 | Bonakdar | H01L 27/14623 |
| 2021/0242262 A1* | 8/2021 | Bonakdar | H01L 27/14621 |

FOREIGN PATENT DOCUMENTS

| | | | | |
|---|---|---|---|---|
| DE | 102019003217 A1 | * | 11/2019 | H01L 27/14603 |
| JP | H05129569 A | * | 5/1993 | |

OTHER PUBLICATIONS

Chang, et al. "Shape-controlled, high fill-factor microlens arrays fabricated by a 3D diffuser lithography and plastic replication method." Optics Express 12.25 (2004): 6366-6371.

Kim, Y. et al., "High-Sensitivity Pixels with a Quad-WRGB Color Filter and Spatial Deep-Trench Isolation" Sensors 2019, 10 pages.

U.S. Appl. No. 16/777,060, Non-Final Office Action dated Oct. 27, 2021, 14 pages.

U.S. Appl. No. 16/777,027, Non-Final Office Action dated Jan. 18, 2022, 16 pages.

* cited by examiner

FLARE-SUPPRESSING IMAGE SENSOR

BACKGROUND

Camera modules in commercial products such as stand-alone digital cameras, mobile devices, automotive components, and medical devices include an image sensor having a pixel array. The pixel array includes a plurality of pixels arranged as a two-dimensional periodic array with a pixel pitch that is between two and three times the wavelength of light incident thereon. Many image sensors include a microlens array, formed of a plurality of microlenses each aligned to a respective pixel, that has two-dimensionally periodic surface height above the pixel array. The periodicity of the image sensor's pixel array and microlens array thereon result in the image sensor resembling a reflective two-dimensional diffraction grating. Part of light incident on the image sensor is diffracted toward the camera's imaging lens. Different elements of the camera, e.g., a cover glass, an IR-cut filter, a surface of the imaging lens, reflect this diffracted light back toward the image sensor, which produces an image artifact known as petal flare.

SUMMARY OF THE EMBODIMENTS

Embodiments disclosed herein reduce petal flare. In a first aspect, a flare-suppressing image sensor includes a first pixel formed in a substrate and a refractive element located above the first pixel. The refractive element has, with respect to a top surface of the substrate, a height profile having at least two one-dimensional local maxima in each of a first cross-sectional plane and a second cross-sectional plane perpendicular to the first cross-sectional plane. Each of the first and second cross-sectional planes is perpendicular to the top surface and intersects the first pixel.

DETAILED DESCRIPTION OF THE EMBODIMENTS

Figure 1:
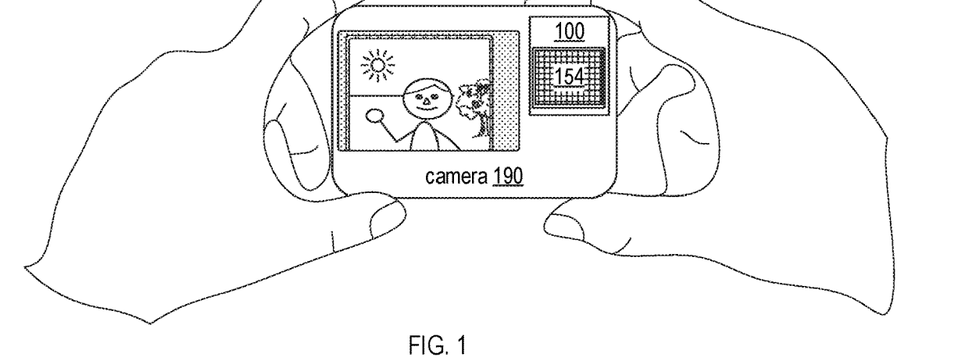
FIG. 1 depicts a camera imaging a scene, in an embodiment.

FIG. 1 shows an image sensor 100, which includes a pixel array 154. In the scenario depicted in FIG. 1, image sensor 100 is incorporated in a camera 190 imaging a scene. Camera 190 includes an image-sensor 100, which includes a pixel array 154. Image sensor 100 may be part of a chip-scale package or a chip-on-board package.

Figure 2:
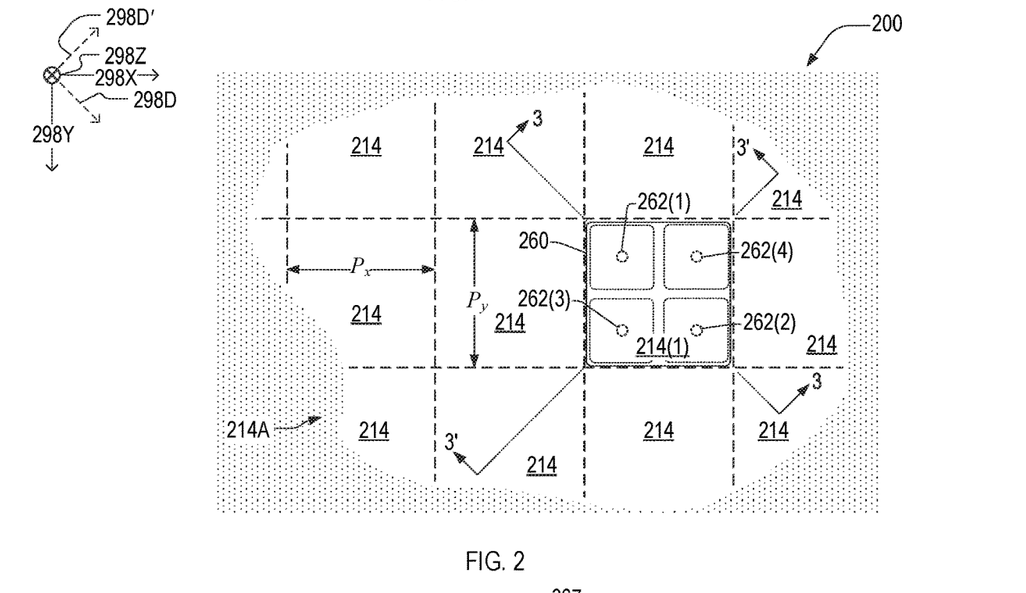
FIGS. 2 and 3 are respective cross-sectional schematics of a flare-suppressing image sensor, which is an embodiment of the image sensor of FIG. 1.

FIG. 2 is a cross-sectional schematic of a flare-suppressing image sensor 200, which is an example of image sensor 100. The cross-section illustrated in FIG. 2 is parallel to a plane, hereinafter the x-y plane, formed by orthogonal directions 298X and 298Y, each of which is orthogonal to direction 298Z. Herein, the x-y plane is formed by orthogonal directions 298X and 298Y, and a plane parallel to the x-y plane is referred to as a transverse plane. Unless otherwise specified, heights of objects herein refer to the object's extent in direction 298Z, or a direction 180° opposite thereto. FIG. 2 denotes a direction 298D that, with direction 298Z, forms a first diagonal plane, hereinafter the d-z plane. FIG. 2 also denotes a direction 298D' that, with direction 298Z, forms a second diagonal plane, hereinafter the d'-z plane.

Figure 3:
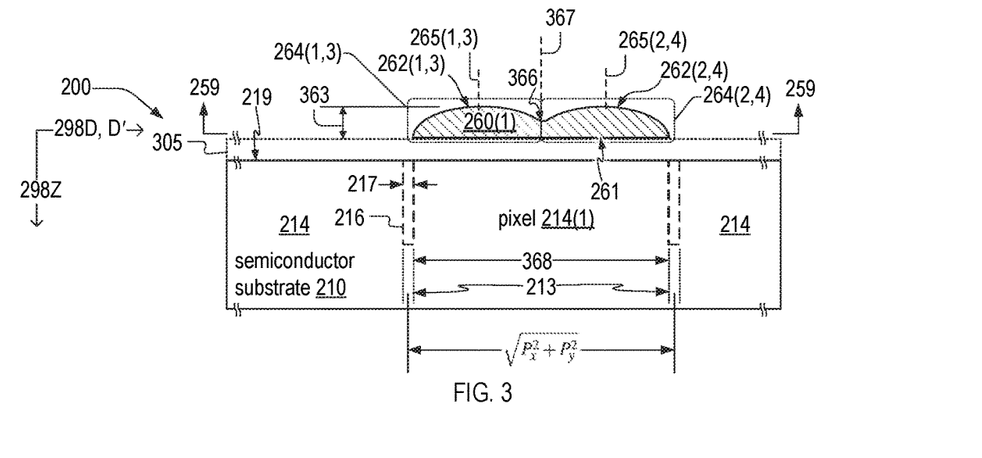

FIG. 2 denotes a cross-sectional plane 3 and a cross-sectional plane 3', which are parallel to the d-z plane and the d'-z plane, respectively. FIG. 3 is a cross-sectional schematic of flare-suppressing image sensor 200 in either one of cross-sectional planes 3 and 3'. FIG. 3 denotes a cross-sectional plane 259, which is the cross-sectional plane of FIG. 2. For sake of clarity, FIG. 2 illustrates elements of semiconductor substrate 210 beneath plane 259; these elements are illustrated with dashed lines. FIGS. 2 and 3 are best viewed together in the following description.

FIGS. 2 and 3 denote a boundary 213 between adjacent pixels of semiconductor substrate 210. In embodiments, image sensor 200 includes a deep-trench isolation layer 216 between adjacent pixels, such that at least a portion of boundary 213 corresponds to a material interface between a deep-trench isolation layer 216 and semiconductor substrate 210. In embodiments, deep-trench isolation layer 216 includes an oxide. Deep-trench isolation layer 216 has a width 217, which may be at least 150 nm such that light incident on deep-trench isolation layer 216 experiences total-internal reflection and is not transmitted to an adjacent pixel.

Image sensor 200 includes a plurality of large pixels 214 formed in a semiconductor substrate 210. Semiconductor substrate 210 has a top surface 219 parallel to the x-y plane. The plurality of large pixels 214 form a pixel array 214A that has a pixel pitch $P_x$ and $P_y$ in respective orthogonal directions x and y. Pixel 214(1) is one of the plurality of large pixels 214. An angle between directions 298D and direction 298X equals $\arctan(P_y/P_x)$. In embodiments, at least one of pitch $P_x$ and $P_y$ is less than or equal to 2.9 μm.

Image sensor 200 includes a refractive element 260(1) above pixel 214(1). Refractive element 260(1) may be center-aligned with pixel 214(1) in at least one of the x-y plane, the x-y plane, the d-z plane, and the d'-z plane. In embodiments, refractive element 260(1) adjoins top surface 219. In embodiments, image sensor 200 includes an intermediate layer 305 between top surface 219 and refractive element 260. Intermediate layer 305 may include one or more layers, examples of which include a spectral filter array, a passivation layer, and an oxide layer.

In each of cross-sectional planes 3 and 3', refractive element 260(1) has a height profile having at least two one-dimensional local maxima 262. In the example illustrated in FIG. 2, refractive element 260(1) includes four local maxima 262(1-4). Callouts to local maxima 262(1-4) in FIG. 2 denote their locations above cross-sectional plane 259. In embodiments, refractive element 260 is formed of a material, such as a glass, having a transition temperature between 140° C. and 180° C., such that it can withstand temperatures of a reflow process associated with image sensor 200.

One aspect of the present embodiments includes the realization that a primary source of petal flare is light incident on, and focused, by a microlens of an adjacent pixel. The present embodiments reduce petal flare by shaping each refractive element 260 such that it has more than one local maximum 262, such that refractive element 260 effectively includes multiple microlenses each transmitting a portion of light incident on refractive element 260.

In embodiments, each local maximum 262 is a one-dimensional local maximum, such that the derivative of the height profile is zero in at least one plane, e.g., one of the x-z plane, the y-z plane, the d-z plane, and the d'-z plane. In embodiments, each local maximum 262 is a multi-dimensional local maximum, such that the derivative of the height profile is zero in at least two dimensions, e.g., at least two of the x-z plane, the y-z plane, the d-z plane, and the d'-z plane.

Figure 4:
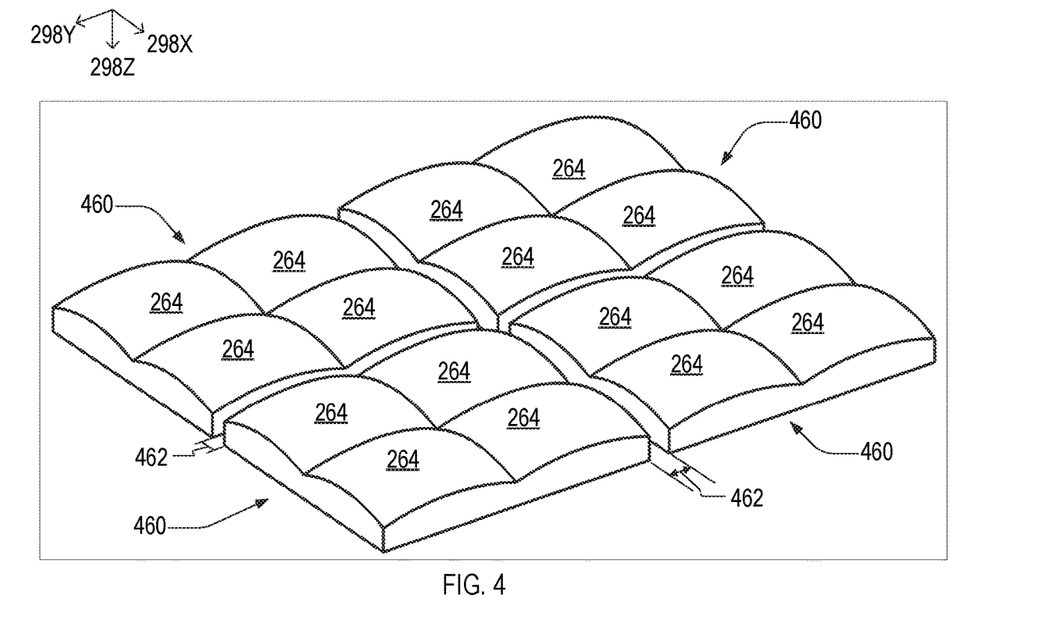
FIG. 4 is an isometric view of an array of refractive elements of one implementation of the flare-suppressing image sensor of FIGS. 2 and 3, in an embodiment.

In embodiments, refractive element 260(1) includes an N-by-N array of microlenses 264, N is a positive integer greater than one and each of local maxima 262(1-4) is a maximum height of microlenses 264(1-4), respectively. In the example of FIG. 2, N=2. Each microlens 264 has a respective optical axis 265 intersecting its local maximum 262. Optical axis 265 may be perpendicular to top surface 219. FIGS. 2 and 3 include cross-sectional views of microlenses 264. FIG. 4 is an isometric view of a two-by-two array of refractive elements 460, each of which includes a two-by-two array of microlenses 264. Refractive element 460 is an example of refractive element 260. Adjacent refractive elements are separated by a distance 462 in at least one of directions 298X and 298Y. Distance 462 may be less than or equal to width 217 of isolation layer 216. In embodiments, distance 462 equals zero.

Refractive element 260 has a bottom surface 261. Each microlens 264 has a peak height 363 beneath its respective local maxima 262. In embodiments, peak height 363 is determined such that each microlens 264 has a back focal length equal to a distance between bottom surface 261 and top substrate surface 219. Refractive element 260 has a width 368, which is in a range between $P_{min}$ and $\sqrt{P_x^2+P_y^2}$. When $P_x=P_y$ are equal, $P_{min}=P_x$; otherwise $P_{min}$ is the smaller of $P_x$ and $P_y$. To achieve such a focal length, each of peak height 363 and the radius of curvature of microlens 264 is between $P_{min}/(2N)$ and $\sqrt{P_x^2+P_y^2}/(2N)$.

In each of cross-sectional planes 3 and 3', refractive element 260 has a local minimum 366 between local maxima 262. In embodiments, local minimum 366 is at least one of (i) equidistant from local maxima 262(1) and 262(2) in cross-sectional plane 3, and (ii) equidistant from local maxima 262(2) and 262(4) in cross-sectional plane 3'.

In embodiments, image sensor 200 includes a plurality of refractive elements 260 each directly above and aligned to a respective large pixel 214. Each refractive element 260 has the properties ascribed to refractive element 260(1) herein. Each refractive element 260 may be directly above a respective large pixel 214. A refractive element 260 is directly above a pixel 214 when a plane normal to top surface 219 and intersecting the pixel 214 also intersects the refractive element 260.

Figure 5:
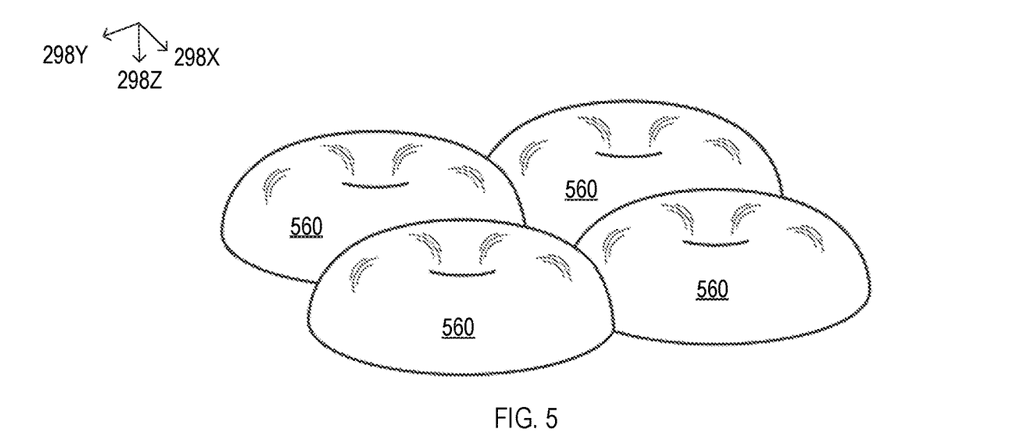
FIG. 5 is an isometric view of an array of annular lenses of another implementation of the flare-suppressing image sensor of FIGS. 2 and 3, in an embodiment.

FIG. 5 is a perspective view of a two-by-two periodic array of annular lenses 560. Annular lens 560 is an example of refractive element 260, and may be rotationally symmetric about an axis 367 that is perpendicular to top surface 319. In embodiments, axis 367 intersects local minimum 366.

Figure 6:
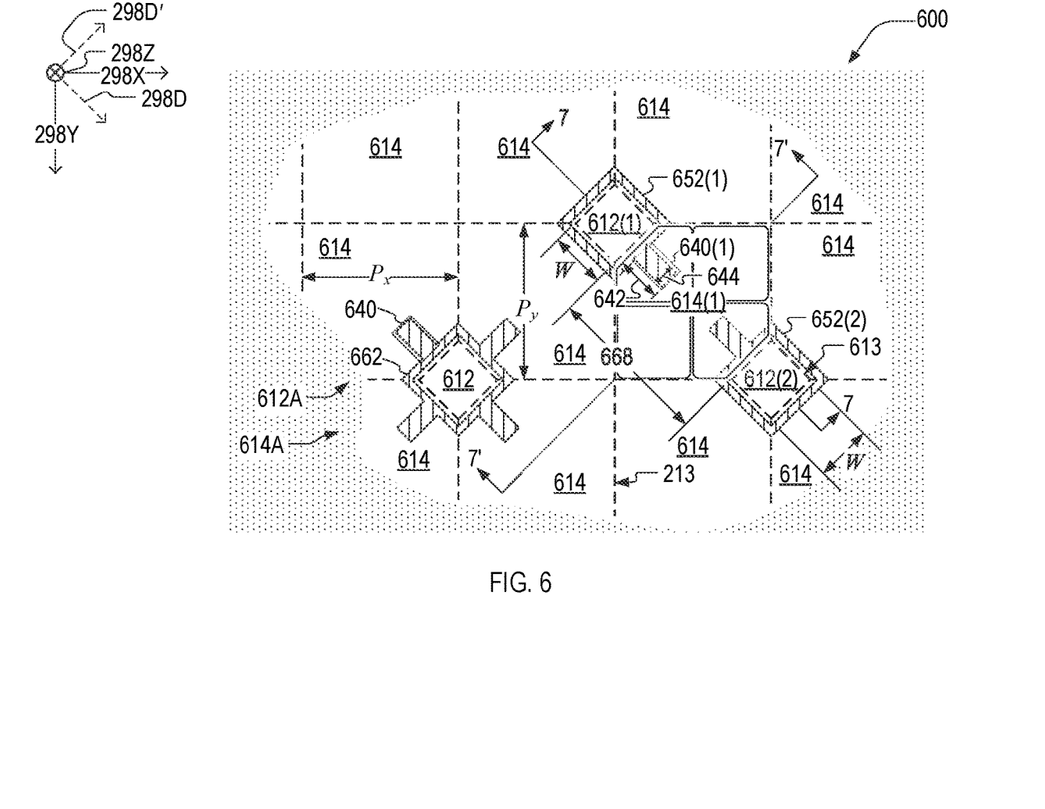
FIGS. 6 and 7 are respective cross-sectional schematics of a flare-suppressing image sensor, which is an example of the image sensor of FIG. 1, in an embodiment.
Figure 7:
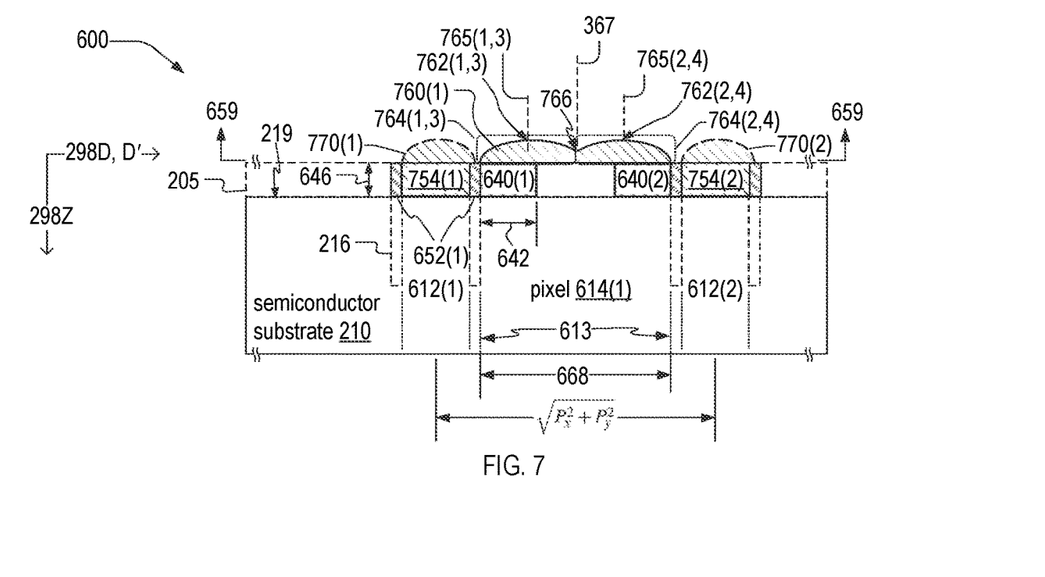

FIGS. 6 and 7 are respective cross-sectional schematics of a flare-suppressing image sensor 600. Image sensor 600 is an example of image sensor 200 where pixels 614 replace pixels 214 and with the addition of small pixels 612(1) and 612(2). Pixels 614 form a pixel array 614A, which is an example of pixel array 214A. FIG. 6 denotes cross-sectional planes 7 and 7', each of which are cross-sectional planes of FIG. 7. FIG. 7 denotes a cross-sectional plane 659, which is the cross-sectional plane of FIG. 6. FIGS. 6 and 7 are best viewed together in the following description.

In direction 298D, a center-to-center separation between small pixels 612(1) and 612(2) equals to $\sqrt{P_x^2+P_y^2}$ in cross-sectional plane 7. In directions 298D and 298D', each of pixels 612(1,2) have a small-pixel width W that is less than both pixel pitch $P_x$ and $P_y$. Pixel 614(1) is between and collinear with small pixels 612(1) and 612(2). A pixel 614 may differ from pixel 214 in terms of features that accommodate one or more small pixels 612 corner-adjacent to the pixel 214. For example, pixel 614 may have an octagonal or hexagonal cross-section in a transverse plane.

In embodiments, small pixels 612(1-4) are part of a plurality of small pixels 612 that form a pixel array 612A. Pixel array 612A has a pixel pitch $P_x$ and $P_y$ in respective directions x and y. Pixel array 612A is offset from pixel array 614A by ½$P_x$ and ½$P_y$ in respective directions x and y. FIG. 6 denotes a boundary 613 between adjacent pixels 614 and 612 of semiconductor substrate 610. Boundary 613 is similar to boundary 213.

In embodiments, image sensor 600 includes microlenses 770(1,2) aligned with small pixels 612(1) and 612(2), respectively. In embodiments, image sensor 600 includes a plurality of microlenses 770 each aligned to a respective small pixel 612, where the plurality of microlenses 770 includes microlenses 770(1,2).

Image sensor 600 includes a refractive element 760(1) aligned with pixel 614(1). Refractive element 760(1) is an example of microlens 260(1). Refractive element 760(1) has a width 668 that is smaller than $\sqrt{P_x^2+P_y^2}$ due to the presence of pixels 612 and/or microlenses 770. In embodiments, width 668 is less than or equal to $\sqrt{P_x^2+P_y^2}-W$. Refractive element 760(1) has local maxima 762, and, in embodiments, includes an array of microlenses 764 each having an optical axis 765, and a local minimum 766. Local maxima 762, microlenses 764, optical axis 765, and local minimum 766 are examples of local maxima 262, microlenses 264, optical axis 265, and local minimum 366.

In embodiments, image sensor 600 includes a first opaque annulus 652(1) center-aligned with microlens 770(1) and located between the microlens 770(1) and top surface 219. In such embodiments, image sensor 600 also includes an opaque extension 640. A technical benefit of opaque extension 640 is to prevent the aforementioned petal flare caused by stray light reflected by image sensor 600. Opaque extension 640 extends, in direction 298D, an extension length 642 from boundary 213 toward second small pixel 612(2). Extension length 642 is less than $L_1 = \frac{1}{2}(\sqrt{P_x^2 + P_y^2} - W)$ such that opaque extension 640 does not extend to a midpoint 215 between small pixels 612(1) and 612(2).

In direction 298Z, opaque element 640 has a thickness 646 which, in embodiments, exceeds an intensity penetration depth $\delta$ of opaque element 240 at free-space electromagnetic wavelength $\lambda_0$, $\delta = \lambda_0/(\pi\kappa)$, where $\kappa$ is the imaginary part of opaque element 640's refractive index at wavelength $\lambda_0$. In embodiments, thickness 646 is between 75 and 125 nanometers.

Opaque element 640 reduces petal flare by blocking diffracted illumination. However, opaque element 640 also blocks image illumination propagating directly to large pixel 614(1) from camera 190's imaging lens. Opaque element 640 has a width 644 in a direction perpendicular to length 642. In an embodiment, width 644 of opaque element 640 is less than or equal to small-pixel width W, such that opaque element 640 blocks diffracted light (resulting in petal flare) while the amount of non-stray light it blocks is reduced. In embodiments, width 644 exceeds intensity penetration depth $\delta$ and is less than small-pixel width W. Width 644 may be between 80 nanometers and 120 nanometers. In an embodiment, small-pixel width W exceeds width 644 by a factor between eight and twelve.

In embodiments, each pixel 614 has a respective refractive element 760 aligned thereto, and each pixel 612 has a respective microlens 770 aligned thereto. Refractive element 760 has a thickness 763 at local maxima 762. Microlenses 770 have a maximum thickness 773. In such embodiments, thickness 763 may equal thickness 773, which enables refractive elements 760 and microlenses 770 to be formed in parallel, e.g., via one or more masking and lithographic steps, and hence decreases fabrication costs of image sensor 600. In embodiments, microlenses 764 and microlenses 770 are identically shaped, e.g., microlenses 764 and 770 have the same radius of curvature and thickness 763 equals thickness 773.

In embodiments, image sensor 600 includes a spectral filter 754(1) that is located between microlenses 770 and top surface 219, aligned to small pixel 612(1), and surrounded by opaque annulus 652(1). Spectral filter 754(1) may be an absorptive filter, a dichroic filter, a plasmonic filter, or a combination thereof In embodiments, opaque annulus 652(1) adjoins spectral filter 754(1).

In embodiments, image sensor 600 includes a spectral filter array 754A that includes an array of spectral filters 754, of which spectral filter 754(1) is one. Each spectral filter 754 is between microlenses 770 and top surface 219, is similar to spectral filter 754(1), and is aligned to a respective pixel 612. For example, spectral filters 754 include a spectral filter 754(2) that is aligned to small pixel 612(2).

In embodiments, image sensor 600 also includes a plurality of opaque annuli 652 each aligned with a respective pixel 612. Opaque annulus 652(1) is one of opaque annuli 652. FIG. 6 denotes opaque annulus 652(2) surrounding spectral filter 754(2). When image sensor 600 includes spectral filter array 754A, each opaque annulus 652 surrounds a respective small spectral filter 754.

In embodiments, image sensor 600 also includes a plurality of opaque elements 640, each of which is monolithically formed with and extending from a respective one of the plurality of opaque annuli 652 in one of direction 298D and direction 298D'. Each opaque extension 640 is an example of, and similar to, opaque extension 640(1).

Each opaque annulus 652 may include more than one opaque element 640 extending therefrom. In embodiments, image sensor 600 includes an opaque annulus 662, which is an example of opaque annulus 652 that includes four opaque extensions 640. In embodiments, opaque extensions 640 are monolithically formed with opaque annulus 652. Each opaque annulus 662 includes (a) two opaque extensions 640 extending away from a center of the opaque annulus 662 along direction 298D, and (b) two opaque extensions 660 extending away from a center of the opaque annulus 652 along direction 298D'.

Figure 8:
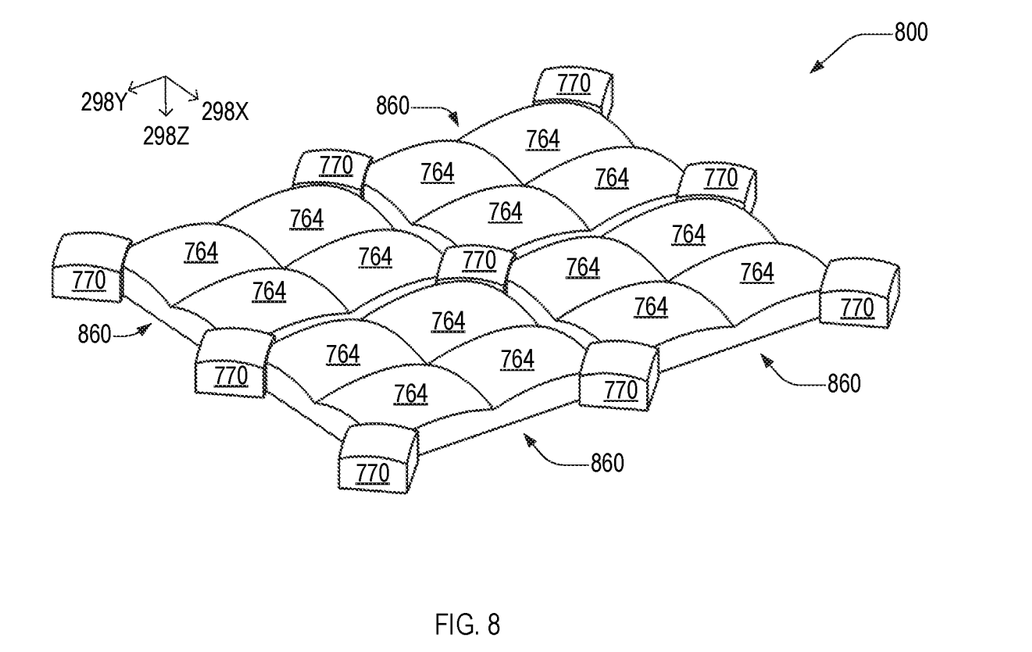
FIG. 8 is an isometric view of an array of refractive elements of one implementation of the flare-suppressing image sensor of FIGS. 6 and 7, in an embodiment.

FIG. 8 is an isometric view of a microlens array 800, which includes an array of microlenses 770 interspersed with an array of refractive elements 860. Each refractive element 860 includes a respective two-by-two array of microlenses 764. Refractive element 860 is an example of refractive element 460. In embodiments, microlens 764 has hexagonal or, as shown in FIG. 8, octagonal cross-section in a plane parallel to the x-y plane, which enables microlens 764 to collect more light than an equivalent lens with a circular cross-section.

Figure 9:
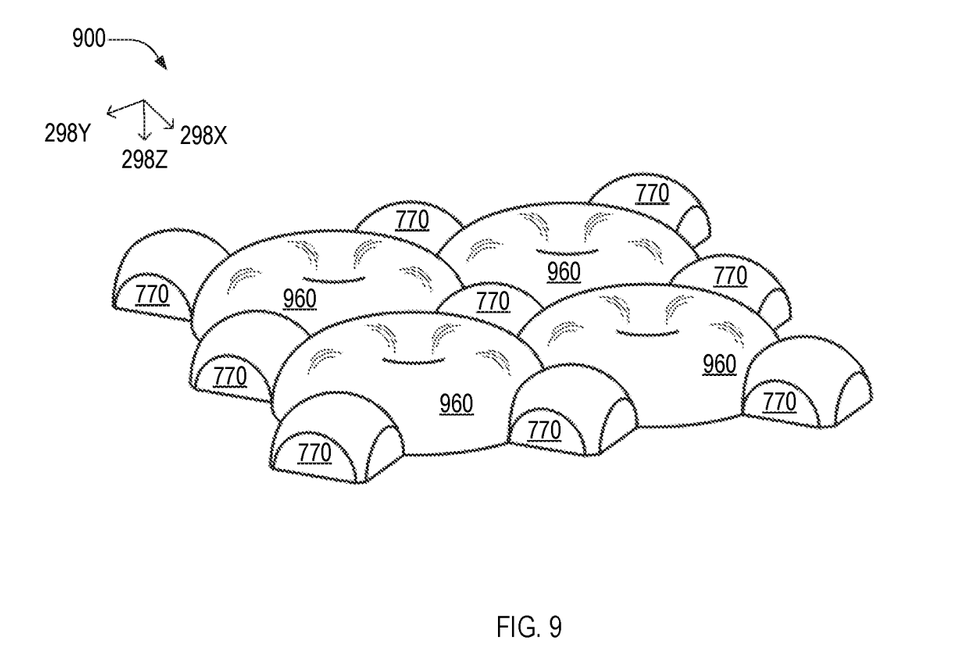
FIG. 9 is an isometric view of an array of annular lenses of another implementation of the flare-suppressing image sensor of FIGS. 6 and 7, in an embodiment.

FIG. 9 is an isometric view of a microlens array 900, which includes an array of microlenses 770 interspersed with array of annular lenses 960. Each annular lens 960 is rotationally symmetric about an axis perpendicular to surface 219, and is an example of refractive element 460, FIG. 4. Microlens 770 may have a circular cross-section, wherein the diameter of the circular cross-section exceeds a distance between opposite sides of the hexagonal cross-section.

Figure 10:
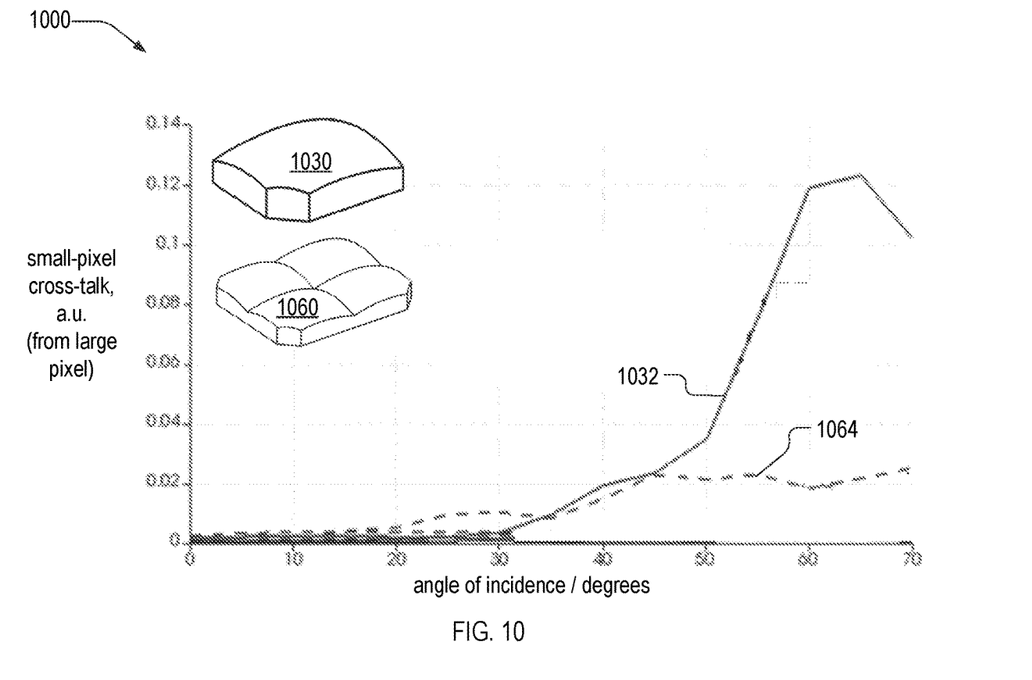
FIG. 10 illustrates angle-dependent cross-talk in a small pixel from a corner-adjacent large pixel having thereon a refractive element of FIG. 7, in an embodiment.
Figure 11:
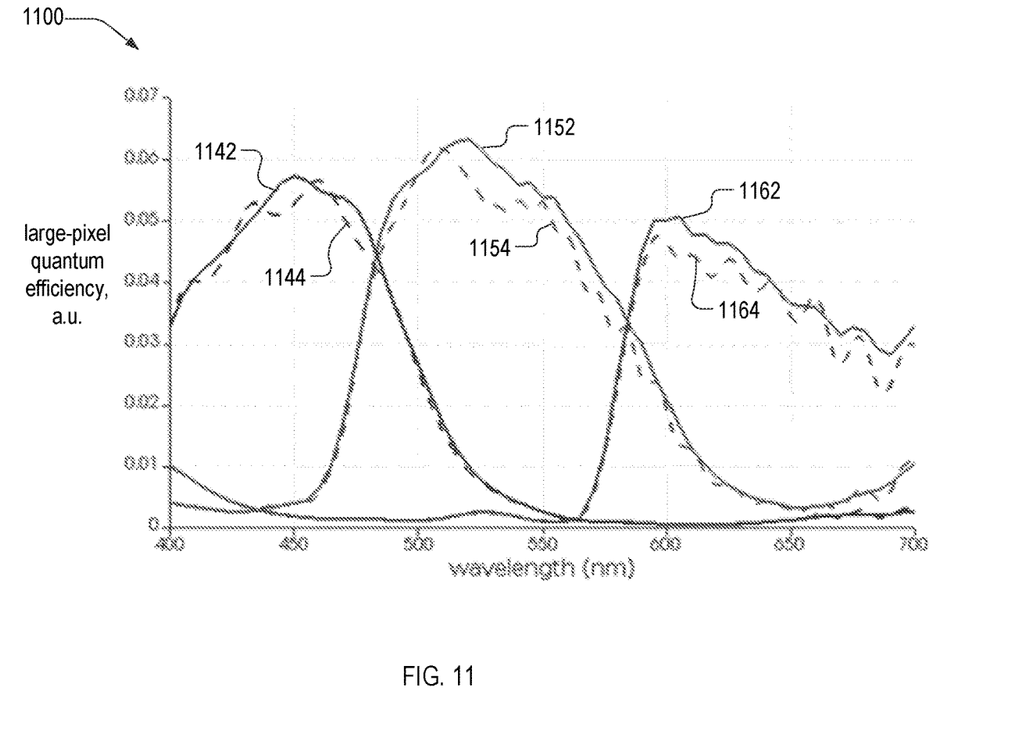
FIG. 11 illustrates spectral responses of the large pixel of FIG. 10 with different spectral filters thereon, in an embodiment.

FIG. 10 is a plot 1000 showing cross-talk from large pixel 614(1) to corner-adjacent small pixel 612(1) as a function of angle of incidence. FIG. 11 is a plot 1100 showing spectral response of large pixels 614 with different combinations of spectral filters and refractive elements thereon. In each of plots 1000 and 1100, pixel width W=1.1 μm and $P_x = P_y = 2.8$ μm.

FIG. 10 includes cross-talk 1032 and 1064. In the example of FIG. 10, large pixel 614 has green spectral filter thereon in intermediate layer 305. Cross-talk 1032 corresponds to when the green spectral filter is between a conventional plano-convex microlens 1030 and large pixel 614. The plano-convex microlens has a height equal to 1.2 μm. Crosstalk 1064 is from the same large pixel 614, where a refractive element 1060 functions as refractive element 260. Refractive element 1060 is an example of refractive element 860 and includes a 2-by-2 array of microlenses 264 that have a peak height 363 and radius equal to 0.6 μm. Replacing conventional microlens 1030 with refractive element 1060 reduces crosstalk by a factor of at least two at incident angles exceeding fifty-one degrees. A potential source of petal flare is cross-talk resulting from diffracted light incident on large pixel 614 at an angle exceeding fifty-one degrees. FIG. 10 illustrates how refractive element 1060 prevents such petal flare.

Plot 1100 includes quantum efficiencies 1142, 1152, and 1162, which correspond to large pixel 614 with conventional plano-convex microlens 1030 thereon above a blue color filter, a green color filter, and a red color filter, respectively in intermediate layer 305. Plot 1000 also includes quantum efficiencies 1144, 1154, and 1164, which correspond to large pixel 614 with refractive element 1060 thereon, and with blue color filter, a green color filter, and a red color filter, respectively in intermediate layer 305. Inspection of plots 1000 and 1100 shoes that refractive element 1060 significantly decreases cross-talk while maintaining comparable quantum efficiencies.

Figure 12:
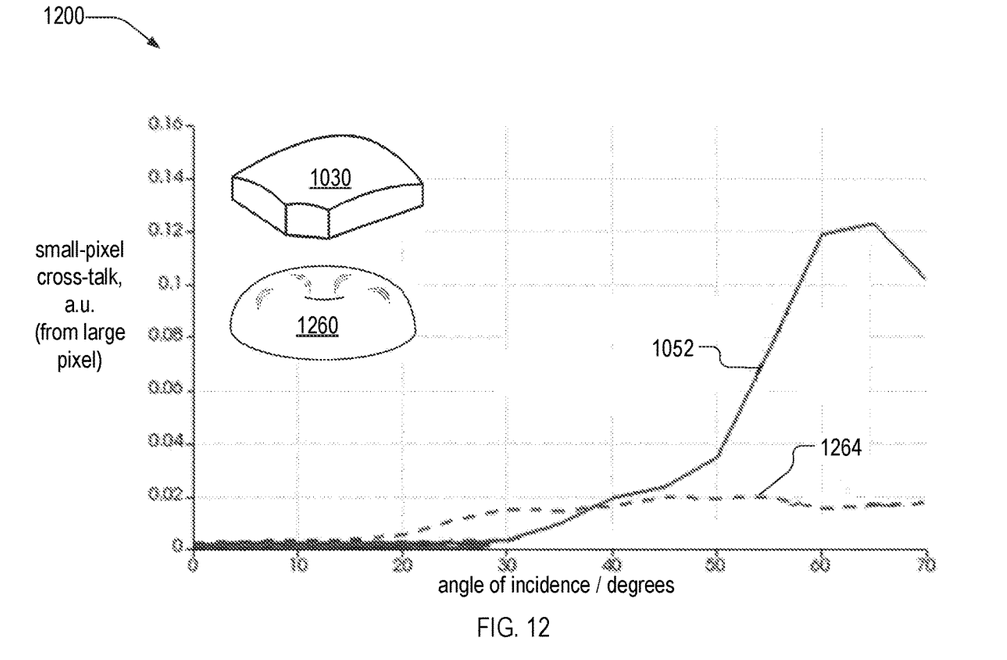
FIG. 12 illustrates angle-dependent cross-talk in a small pixel from a corner-adjacent large pixel having thereon an annular lens of FIG. 9, in an embodiment.
Figure 13:
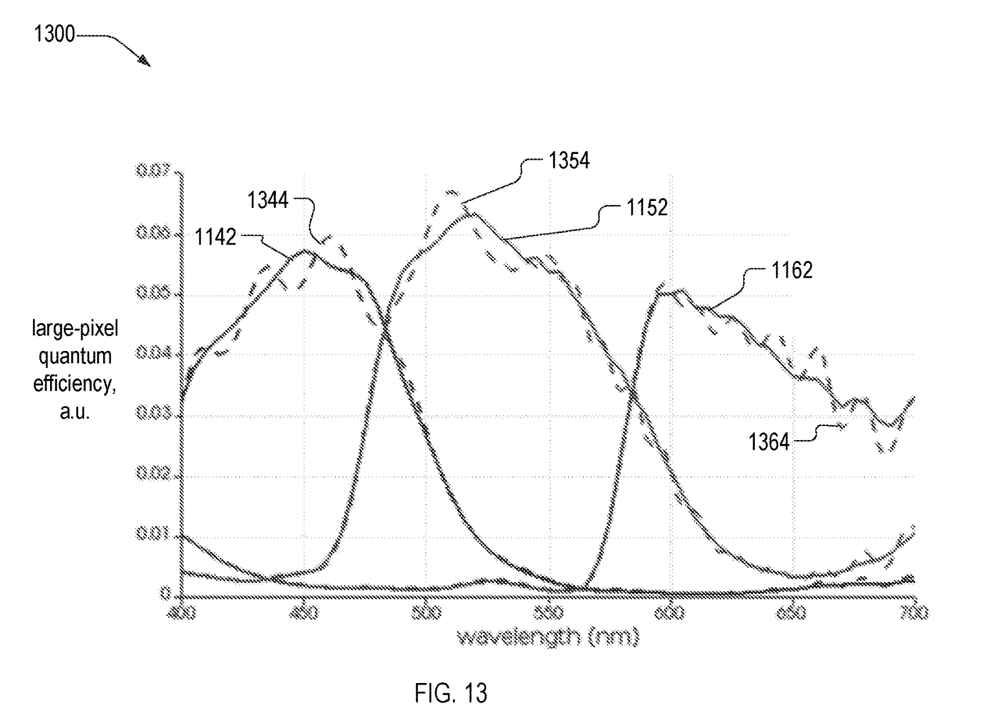
FIG. 13 illustrates spectral responses of the large pixel of FIG. 12 with different spectral filters thereon, in an embodiment.

FIG. 12 is a plot 1200 showing cross-talk from a large pixel 614 to a corner-adjacent small pixel 612 as a function of angle of incidence. FIG. 13 is a plot 1300 showing spectral response of large pixels 614 with different combinations of spectral filters and refractive elements thereon. In each of plots 1200 and 1400, pixel width W=1.1 μm and $P_x=P_y=2.8$ μm.

Plot 1200 includes cross-talk 1032 introduced in FIG. 10 and cross-talk 1264. Crosstalk 1264 is from the same large pixel 614, where an annular lens 1260 functions as refractive element 760. Annular lens 1260 is an example of annular lens 560, and has a 0.6-μm height and a lobe-radius (of curvature) equal to 0.6 μm. In this example, replacing plano-convex microlens 1030 with annular lens 960 reduces crosstalk by a factor of at least two at incident angles exceeding fifty-one degrees.

FIG. 13 is a plot 1300 showing spectral response of large pixels 614 with different combinations of spectral filters and refractive elements thereon. Plot 1300 includes quantum efficiencies 1142, 1152, and 1162, introduced in FIG. 11. Plot 1300 also includes quantum efficiencies 1344, 1354, and 1364, which correspond to large pixel 614, where plano-convex microlens 1030 is replaced by the example of annular lens 960 introduced in the description of FIG. 12, and with blue color filter, a green color filter, and a red color filter, respectively in intermediate layer 305. Inspection of plots 1200 and 1300 shows that refractive element 260 significantly decreases cross-talk while maintaining comparable quantum efficiencies.

Figure 14:
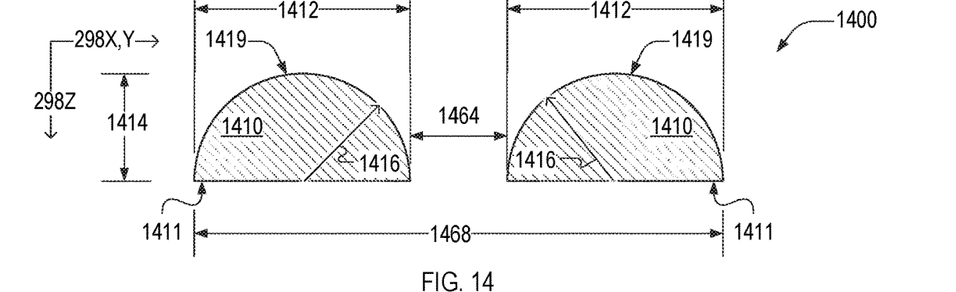
FIG. 14 is a cross-sectional view of an annular lens of FIG. 5, in an embodiment.

FIG. 14 is a cross-sectional view of an annular lens 1400 in one or both of the x-z plane and the y-z plane. Annular lens 1400 is an example of annular lens 560 and 960. In the cross-sectional view of FIG. 14, annular lens 1400 has two identical lobes 1410, each with a planar bottom surface 1411 and a top surface 1419. Each lobe 1410 has a width 1412, and annular lens 1400 has a width 1468 that is greater than or equal to two times width 1412. Width 1468 is an example of width 668.

When width 1468 exceeds two times with 1412, opposing top surfaces 1419 are separated by a hole diameter 1464, which is a diameter of an aperture of annular lens 1400. In embodiments, hole diameter 1464 divided by width 1468 is between zero and 0.2. For example, when width 1468 equals 2.8 μm, hole diameter 1464 may range from zero to 500 nanometers. We found that the spectral response of a 2.8-μm pixel ($P_x=P_y=2.8$ μm) with annular lens 1400 thereon varied little as a function of hole diameter 1464 between zero to 500 nanometers.

Lobe 410 has a height 1414 and a lobe radius 1416. In embodiments, a maximum value of lobe radius 1416 is $(P_{x,y}-d_{hole})/4$, where $P_{x,y}$ is one of pixel pitch $P_x$ and $P_y$, and $d_{hole}$ equals hole diameter 1464. Annular lens 1400 is rotationally symmetric about an axis parallel to the z axis.

Figure 15:
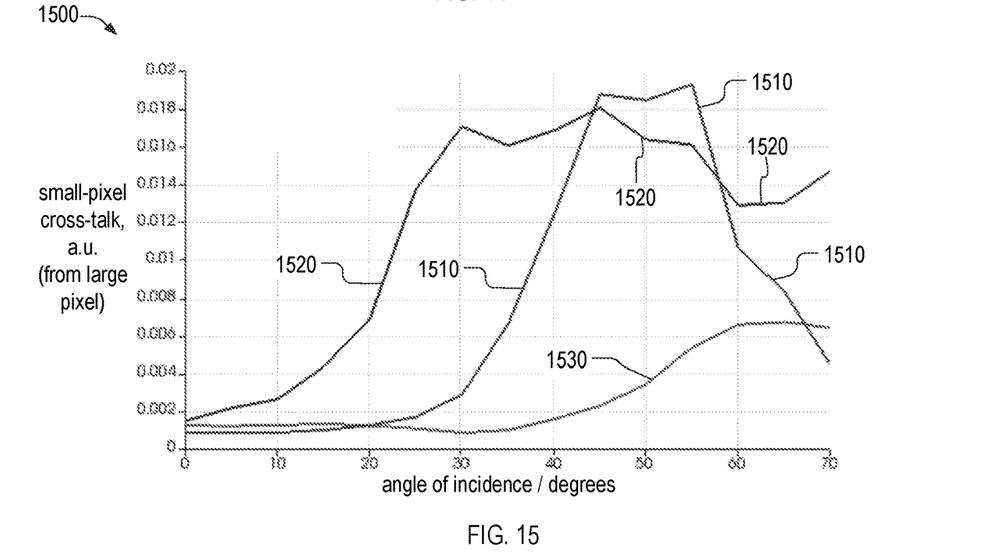
FIG. 15 illustrates angle-dependent cross-talk in a small pixel from a corner-adjacent large pixel having thereon at least one of an opaque extension of FIG. 6 and an annular lens of FIG. 9.

FIG. 15 is a plot 1500 showing numerically simulated cross-talk from a large pixel 614 to a corner-adjacent small pixel 612 as a function of angle of incidence. In this example, large pixel 614 has a red color filter thereon, and small pixel 612 has a green color filter thereon, each of which are in intermediate layer 305. In the numerical simulations generating FIG. 15, small pixel width W=1.1 μm, $P_x=P_y=2.8$ μm, both height 1414 and lobe radius 1416 of the simulated annular microlens 960 equal 0.6 μm, and extension length 642 equals 250 nm.

Plot 1500 includes cross-talk 1510, 1520, and 1530. Cross-talk 1510 is from large pixel 614 with a conventional plano-convex microlens thereon and opaque extensions 640. Cross-talk 1520 is from a large pixel 614 with an annular microlens 960 thereon and no opaque extensions. Cross-talk 1530 is from a large pixel 614 with both opaque extensions 640 and an annular microlens 960 thereon. Comparison of cross-talk 1510, 1520, and 1530 reveals that the combination of annular microlens 960 and opaque extensions 640 (cross-talk 1530) best reduces cross-talk.

Figure 16:
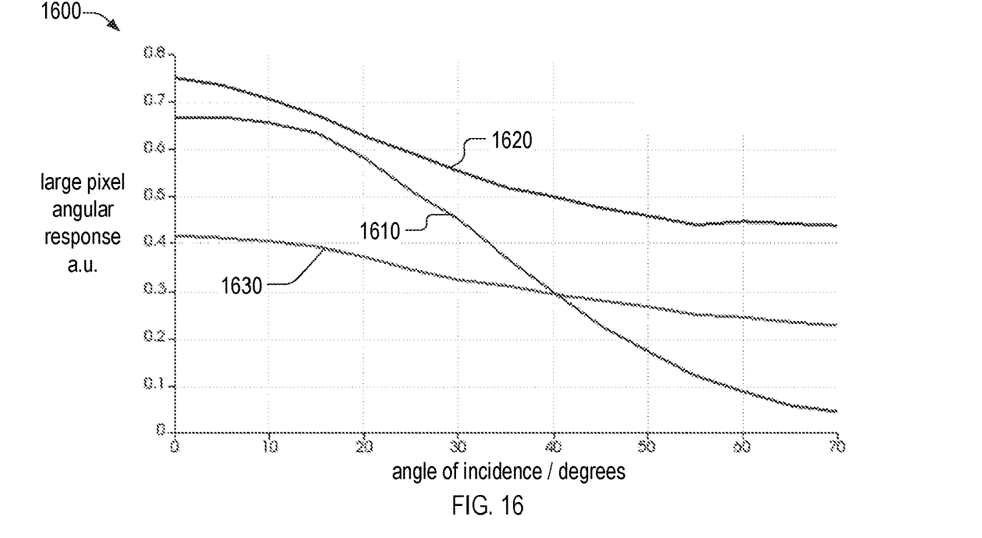
FIG. 16 illustrates spectral responses of the large pixel of FIG. 15, in an embodiment.

FIG. 16 is a plot 1600 showing angular responses of the large pixel 614 of FIG. 15. Plot 1600 includes angular responses 1610, 1620, and 1630, the color filter and annular lens configurations of which correspond to cross-talk 1510, 1520, and 1530, respectively.

Combinations of Features

Features described above as well as those claimed below may be combined in various ways without departing from the scope hereof. The following enumerated examples illustrate some possible, non-limiting combinations.

(A1) A flare-suppressing image sensor includes a first pixel formed in a substrate and a refractive element located above the first pixel. The refractive element has, with respect to a top surface of the substrate, a height profile having at least two one-dimensional local maxima in each of a first cross-sectional plane and a second cross-sectional plane perpendicular to the first cross-sectional plane. Each of the first and second cross-sectional planes is perpendicular to the top surface and intersects the first pixel.

(A2) In the image sensor (A1), the refractive element may include an N-by-N array of microlenses, N being an integer greater than one. Each of the plurality of microlenses has a respective optical axis that intersects the first pixel.

(A3) In the image sensor (A1), each respective optical axis may be perpendicular to the top surface.

(A4) In any of image sensors (A1)-(A3), N may equal two.

(A5) In any of image sensors (A1)-(A4), the refractive element may be rotationally symmetric about an axis perpendicular to the top surface, the height profile having exactly two local maxima in each of the first and second cross-sectional planes.

(A6) In any image sensor (A5), the height profile may include a local minimum equidistant from each of the local maxima.

(A7) Any of image sensors (A1)-(A6) may further include a plurality of large pixels in the semiconductor substrate, a first small pixel, and a second small pixel. The plurality of large pixels forms a pixel array that has a pixel pitch $P_x$ and $P_y$ in respective orthogonal directions x and y each parallel to the top surface. The first pixel is one of the plurality of large pixels. Each of the first and a second small pixel have (a) a center-to-center separation equal to $\sqrt{P_x^2+P_y^2}$ in a first direction and (b) in the first direction, a small-pixel width W less than both pixel pitch $P_x$ and $P_y$. The first pixel is between the first and second small pixels.

(A8) In any image sensor (A7), an angle between the first direction and direction x may equal $\arctan(P_y/P_x)$.

(A9) Any of image sensors (A7) and (A8) may further include a first microlens aligned to the first small pixel and a second microlens aligned to the second small pixel.

(A10) Any image sensor (A9) may further include a first opaque annulus and a first opaque element. The first opaque annulus is center-aligned with the first microlens and located between the first microlens and the top surface. The first opaque element extends a length $L_1$ from the first opaque annulus in the first direction. Length $L_1$ is less than ½($\sqrt{P_x^2+P_y^2}-W$) from a boundary between the first small pixel and the first pixel and toward the second small pixel. In a second direction perpendicular to the first direction, the first opaque element has a first width less than or equal to small-pixel width W.

(A11) Any image sensor (A10) may further include a spectral filter located between the first microlens and the top surface, aligned to the first small pixel, and surrounded by the first opaque annulus.

(A12) Any image sensors (A10) and (A11) may further include a second opaque annulus and a second opaque element. The second opaque annulus is center-aligned with the second microlens and located between the second microlens and the top surface. The second opaque element extends a length $L_2$ from the first opaque annulus opposite the first direction. Length $L_2$ is less than ½($\sqrt{P_x^2+P_y^2}-W$) from a boundary between the second small pixel and the first pixel and toward the first small pixel. The second opaque element has, in the second direction, a second width less than or equal to small-pixel width W.

(A13) Any image sensor (A12) may further include a second spectral filter located between the second microlens and the top surface, aligned to the second small pixel, and surrounded by the second opaque annulus.

(A14) Any of image sensors (A7)-(A13) may further include a third and a fourth small pixel having a center-to-center separation equal to $\sqrt{P_x^2+P_y^2}$ in the second direction and each having small-pixel width W in the first direction. The first pixel is between the third and fourth small pixels. The first and third small pixels have a center-to-center separation equal to $P_x$; the second and fourth small pixels have a center-to-center separation equal to $P_y$.

(A15) In any of image sensors (A1)-(A14) the refractive element may be formed of a glass having a transition temperature between 140° C. and 180° C.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A flare-suppressing image sensor comprising:
   a first pixel formed in a substrate;
   a refractive element above the first pixel, having, with respect to a top surface of the substrate, a height profile having at least two one-dimensional local maxima in each of a first cross-sectional plane and a second cross-sectional plane perpendicular to the first cross-sectional plane, each of the first and second cross-sectional planes being perpendicular to the top surface and intersecting the first pixel;
   a plurality of large pixels in the substrate and forming a pixel array that has a pixel pitch $P_x$ and $P_y$ in respective orthogonal directions x and y each parallel to the top surface, the first pixel being one of the plurality of large pixels;
   a first and a second small pixel having a center-to-center separation equal to $\sqrt{P_x^2+P_y^2}$ in a first direction and each having, in the first direction, a small-pixel width W less than both pixel pitch $P_x$ and $P_y$, the first pixel being between the first and second small pixels;
   a first microlens aligned to the first small pixel;
   a first opaque annulus center-aligned with the first microlens and located between the first microlens and the top surface; and
   a first opaque element extending a distance $L_1$ from the first opaque annulus in the first direction, $L_1$ being less than ½$\sqrt{P_x^2+P_y^2}-W$) from a boundary between the first small pixel and the first pixel and toward the second small pixel, and having, in a second direction perpendicular to the first direction, a first width less than or equal to small-pixel width W.

2. The image sensor of claim 1, the refractive element including an N-by-N array of microlenses, N being an integer greater than one, each microlens of the N by-N array of microlenses having a respective optical axis that intersects the first pixel.

3. The image sensor of claim 2, each respective optical axis being perpendicular to the top surface.

4. The image sensor of claim 2, N being equal to two.

5. The image sensor of claim 1, the refractive element being rotationally symmetric about an axis perpendicular to the top surface, the height profile having exactly two local maxima in each of the first and second cross-sectional planes.

6. The image sensor of claim 5, the height profile including a local minimum equidistant from each of the local maxima.

7. The image sensor of claim 1, an angle between the first direction and direction x equaling arctan($P_y/P_x$).

8. The image sensor of claim 1, further comprising a first microlens aligned to the first small pixel and a second microlens aligned to the second small pixel.

9. The image sensor of claim 1, further comprising a spectral filter located between the first microlens and the top surface, aligned to the first small pixel, and surrounded by the first opaque annulus.

10. The image sensor of claim 8, further comprising:
    a second opaque annulus center-aligned with the second microlens and located between the second microlens and the top surface; and
    a second opaque element extending a distance $d_2$ from the first opaque annulus opposite the first direction, $d_2$ being less than ½$\sqrt{P_x^2+P_y^2}-W$) from a boundary between the second small pixel and the first pixel and toward the first small pixel, and having, in the second direction, a second width less than or equal to small-pixel width W.

11. The image sensor of claim 10, further comprising a second spectral filter located between the second microlens and the top surface, aligned to the second small pixel, and surrounded by the second opaque annulus.

12. The image sensor of claim 1, further comprising:
    a third and a fourth small pixel having a center-to-center separation equal to $\sqrt{P_x^2+P_y^2}$ in the second direction and each having small-pixel width W in the first direction, the first pixel being between the third and fourth small pixels, the first and third small pixels having a center-to-center separation equal to $P_x$, the second and fourth small pixels having a center-to-center separation equal to $P_y$.

13. A flare-suppressing image sensor comprising:
a pixel array formed in a substrate and including a first pixel; and
a refractive element above the first pixel and having a height profile that includes a first local maximum, a second local maximum, a first convex lobe that includes the first local maximum, and a second convex lobe that includes the second local maximum and adjoins the first convex lobe at a local minimum of the height profile located between the first local maximum and the second local maximum.

14. The image sensor of claim 13,
the pixel array having (i) a plurality of pixel-columns each separated by a first pitch in a pixel-row direction and (ii) a plurality of rows each separated by a second pitch in a pixel-column direction;
in a row-oriented cross-sectional plane parallel to the pixel-row direction and perpendicular to a top surface of the substrate, the refractive element including two first lobes each having (i) a first height equal to first local maximum and (ii) a first radius of curvature not exceeding the first pitch divided by four; and
in a column-oriented cross-sectional plane parallel to the pixel-column direction and perpendicular to the top surface, the refractive element including two second lobes each having (i) a second height equal to the second local maximum and (ii) a second radius of curvature not exceeding the second pitch divided by four.

15. The image sensor of claim 13, the height profile lacking a third local maximum between the first local maximum and the second local maximum.

16. The image sensor of claim 13, the refractive element including an N-by-N array of microlenses, N being an integer greater than one, each microlens of the N-by-N array of microlenses having a respective optical axis that intersects the first pixel.

17. A flare-suppressing image sensor comprising:
a pixel array formed in a substrate and including a first pixel; and
a refractive element above the first pixel that (a) is rotationally symmetric about an axis perpendicular to a top surface of the substrate, (b) has a height profile having exactly two local maxima in two perpendicular cross-sectional planes that are each perpendicular to the top surface, and (c) forms an aperture that has a width not exceeding one-fifth of a pitch of the pixel array.

\* \* \* \* \*